United States Patent [19]

Lipp

[11] Patent Number: 5,038,349
[45] Date of Patent: Aug. 6, 1991

[54] METHOD FOR REDUCING MASKING OF ERRORS WHEN USING A GRID-BASED, "CROSS-CHECK" TEST STRUCTURE

[75] Inventor: Robert Lipp, Los Gatos, Calif.

[73] Assignee: Cross-Check Technology, Inc., San Jose, Calif.

[21] Appl. No.: 398,794

[22] Filed: Aug. 25, 1989

[51] Int. Cl.⁵ .............................................. G01R 31/28
[52] U.S. Cl. .................................. 371/22.1; 371/22.6
[58] Field of Search .................... 371/22.3, 22.4, 22.5, 371/22.6, 22.1

[56] References Cited

U.S. PATENT DOCUMENTS

| | | | |
|---|---|---|---|
| 4,513,418 | 4/1985 | Bardell, Jr. et al. | 371/22.4 |
| 4,709,366 | 11/1987 | Scott et al. | 371/22.6 |
| 4,745,355 | 5/1988 | Eichelberger et al. | 371/22.3 |
| 4,749,947 | 6/1988 | Gheewala | 371/22.6 |
| 4,791,359 | 12/1988 | Raymond et al. | 371/22.6 |
| 4,802,133 | 1/1989 | Kanuma et al. | 371/22.6 |
| 4,855,670 | 8/1989 | Green | 371/22.3 |
| 4,937,826 | 6/1990 | Gheewala et al. | 371/22.1 |
| 4,975,640 | 12/1990 | Lipp | 371/22.6 |

OTHER PUBLICATIONS

McCluskey, "Built-In Self-Test Techniques", *IEEE Design & Test*, pp. 21-28 (Apr. 1985).
Savir, "Probabilistic Test", *Built-In Test-Concepts and Techniques*, pp. 57-79.
McCluskey, "Input Test Stimulus Generation", *Built--In Test Concepts and Techniques*, pp. 37-56.
Gloster et al., "Boundary Scan with Built-In Self-Test", *IEEE Design & Test of Computers*, pp. 36-44 (Feb. 1989).

*Primary Examiner*—Charles E. Atkinson
*Attorney, Agent, or Firm*—Townsend and Townsend

[57] ABSTRACT

Several methods for reducing the occurrence of masking of errors when using "Cross-Check" integrated circuit testing arrays and data compression devices such as multiple input shift registers are disclosed. The methods reduce the probability that successive faults within the logic circuit nodes of the integrated circuit will cancel one another by insuring that signals from logically proximate circuit nodes are either not provided sequentially to the data compression circuitry or are provided in such a way as to store any given error in at least two different locations.

17 Claims, 8 Drawing Sheets

METHOD FOR REDUCING MASKING OF ERRORS WHEN USING A GRID-BASED, "CROSS-CHECK" TEST STRUCTURE

FIELD OF THE INVENTION

This invention relates to the testing of integrated circuits. More particularly it relates to a method for reducing testing errors when using a "Cross-Check" test structure.

BACKGROUND OF THE INVENTION

The "Cross-Check" test structure allows up to 100 percent electrical testing of very large scale integrated circuits by the addition of an array of test points to the integrated circuit (IC) being tested. This test structure and its method of operation are described in U.S. Pat. No. 4,749,947 to T. Gheewala entitled "GRID-BASED, "CROSS-CHECK" TEST STRUCTURE FOR TESTING INTEGRATED CIRCUITS." That patent is hereby incorporated in its entirety into this application.

For the purposes of this application, the structure should be understood to consist of a grid of externally as well as individually accessible probe-lines and sense-lines with electronic switches at the crossings of the probe- and sense-lines. One end of the switches is tied to an array of test-points on the IC that are to be either monitored or controlled during the testing, and the other end of the switches is tied to a sense-line. The ON and the OFF states of the switches are controlled by probe-lines. The probe- and sense-lines are connected to test electronics, thus permitting the test electronics to control the electrical signals on the probe-lines and to measure or apply signals on the sense-lines.

The use of the "Cross-Check" test structure generates a tremendous volume of test data. Typically, the output node of every combinatorial logic gate in the IC is tested every clock cycle. Data compression is commonly used to reduce this test data to a manageable quantity. One of the most common forms of data compression requires the use of a Multiple Input Linear Feedback Shift Register ("MISR"). When a MISR is used for data compression with a "Cross-Check" test grid, test data from the sense lines of the "Cross-Check" grid is loaded in parallel into the MISR. After the initial data is loaded, data in the MISR is exclusive ORed ("XORed") with new data generated during each subsequent clock cycle. Data is shifted one bit within the MISR every clock cycle. Various MISR output bits may be further XORed and fed back to any input or inputs of the MISR.

Figure 1:
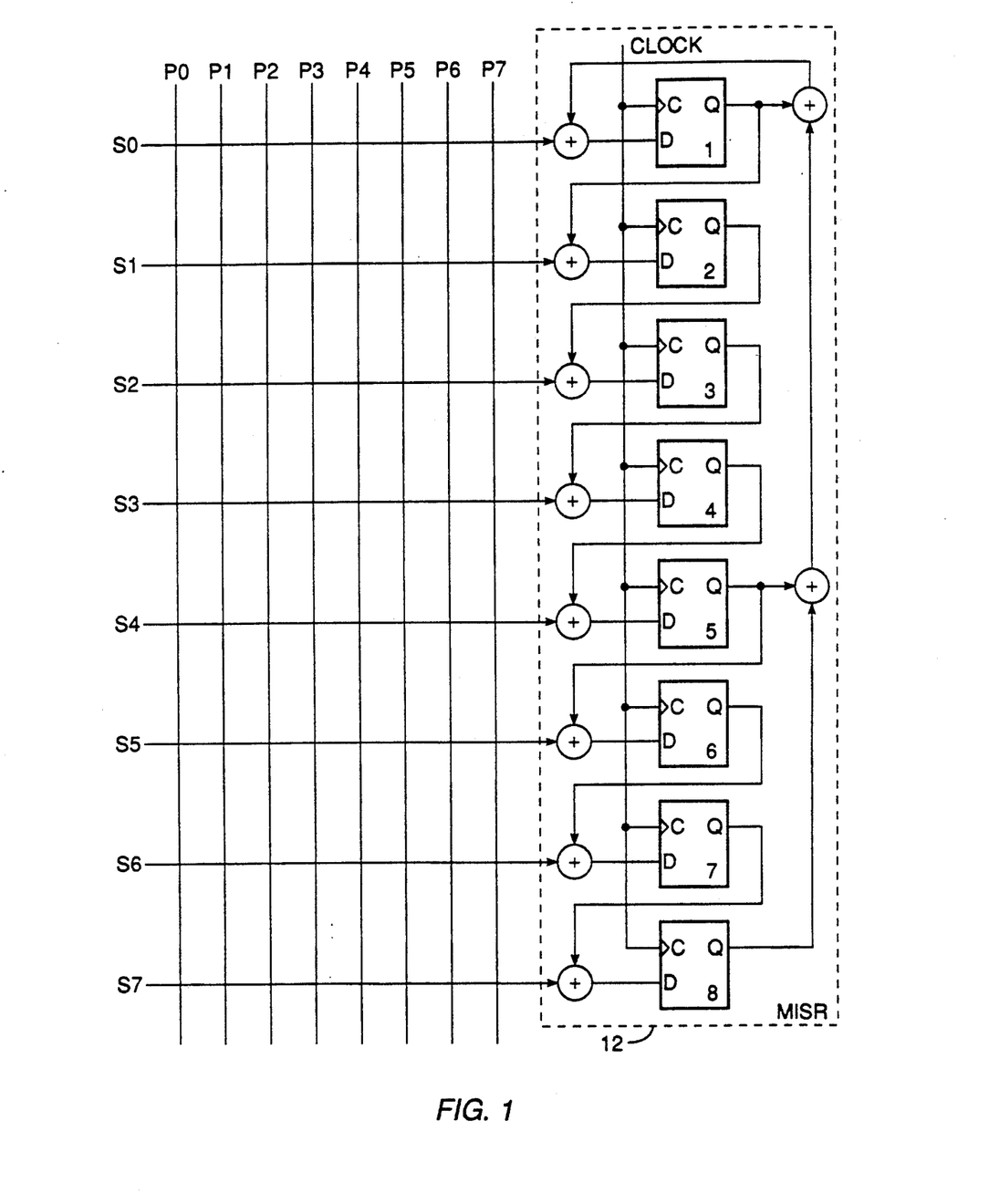
FIG. 1 is a schematic diagram showing an MISR shift register attached to a "Cross-check" testing apparatus.

As shown in FIG. 1, MISR 12 has 8 registers labelled 1 through 8, the outputs of registers 5 and 8 being XORed, the result of which is XORed with the output of register 1. Finally, the result from this XOR operation is fed back to the input of register 1. XOR circuits 13 are coupled to the output of the previous register and the input for each register, except, as noted, register 1, and perform the "XOR" function. Alternative embodiments could operate with cellular automata as long as appropriate modification is made.

A possible problem with data compression is the unintentional concealment of errors or "masking". Any single error will cause the data on the sense line receiving that error to be opposite to its correct value. In turn this will cause one bit in the MISR to be similarly incorrect. Given the nature and structure of an MISR, such an error will propagate, spreading to multiple locations with time as the data within the MISR is fed back to the MISR's inputs. However, if another error is detected and loaded into the same location in the MISR as that containing the previous error, the two errors may cancel one another through the XOR operation. Thus, the second error "masks" the first. In addition to such single bit masking of errors, multiple bit masking of errors is also possible, albeit much less likely.

Within the context of "Cross-Check" testing, two or more purely random errors have a very low probability of masking one another. Two unlikely conditions must occur to cause such a masking of an error.

First, the error which will mask the first error must be detected during every, but only every, test cycle within which the first error is detected. These are the only times that the second error can mask the first error and not itself cause a new, detectable error. For example, if the first error consists of a short to the power supply voltage $V_{DD}$, which would appear as a "stuck-at-one" error, the error will only be detectable when the correct logic output should be a logic zero. During the test cycles that the logic level is expected to be a logic one, this type of error will not be detectable.

Second, the error must be in the proper physical location to mask the first error. For example, assume a circuit with 10,000 test points and 1,000 test cycles. If, on the average, an error is XORed and fed back to the MISR input after four MISR clock cycles, there are a maximum of four different physical locations (the four locations where the error is stored before being fed back) where an error could be masked before it propagates into multiple locations. The probability of this occurring is 4 in 10,000 during any given clock cycle. For the two errors to mask one another, they must additionally be in the same detectable or undetectable state during every clock cycle. As the errors are unrelated, there is only a 50% chance that the second error will be in the correct state to mask, or not mask, the first error. The probability of masking an error under these conditions can be given as:

$$P = (4/10,000)(0.5^{1,000}) \approx 1 \times 10^{-300}$$

which is so small as to be negligible.

However, errors may be related because of their interconnection (logical proximity) in the IC. In such cases, the probability of masking an error is much higher. For example, a node shorted to $V_{DD}$ will be stuck at logic level one. If this node is coupled to the input of an inverter, the output of the inverter will always be zero. Thus every time the first error is detected, the second one also is detected. If the output of the inverter is in the proper location to mask the first error, it will do so every time. Additionally, these nodes will drive other logic elements whose logic states must also be taken into account.

As the purpose of the software used to lay out an IC is to minimize the physical interconnect length between features and components, the probability of logically proximate features and components being physically close to one another on the IC is high. In such cases the probability of physical locations allowing masking of an error is commonly between 2 and 10 percent.

It is also a necessary prerequisite for masking an error that the error not propagate to other logically proximate nodes. For any given test cycle, the probability of the necessary non-propagation is on the order of 10 to 50 percent.

Finally, the number of nodes likely to have the condition such that the cancelling error pattern is the only pattern applied has also been found to be from one to ten percent. The final probability of masking an error therefore falls within the range of $$P_1 = (0.02)(0.10)(0.01) = 0.002\% \text{ and}$$

$$P_2 = (0.10)(0.50)(0.1\%) = 0.5\%,$$

with the median probability $P_3 = 0.05\%$.

The probability of masking an error reduces the quality of the test, increasing the probability that a bad device will be deemed good. These levels of test are insufficient to assure high shipment lot quality.

The percentage of defective units (DU) in a lot due to masking an error is given by the formula:

---
DU = (# bad)/[# Good + # Bad]
(# Good) = process yield (Y)
(# Bad) = (1 − Y)P, where P equals the probability of a bad device passing the test due to masking an error.
---

Therefore, $$DU = (1-y)P/(Y+(1-Y)*(P))$$

For the case where Y = 10% and P = $P_2$ (see above):

$$DU = (1-0.1)(0.005)/(0.1+(1-0.1)(0.005)) = 4.3\%$$

The last calculation shows that in some not unlikely scenarios, the risk of a defect in the IC being undetected by the "Cross-Check" circuit is not acceptably small.

Thus, there is a need for either new circuitry or new methods of use which will, when combined with "Cross-Check" testing circuitry, substantially reduce the possibility that errors will be masked.

SUMMARY OF THE INVENTION

The present invention details three methods which can be used in conjunction with the "Cross-Check" testing circuitry to reduce the probability of masking an error.

The first method reduces the probability by changing the testing (probing) order so that test nodes which are located in close physical proximity to one another are not tested until after a possible error has had an opportunity to spread to multiple locations within the MISR.

The second method requires that the test array be tested (probed) at least twice for each test cycle. During the second and subsequent testing cycles the test (probe) lines are activated in a different order, reducing the probability of masking an error by requiring a multiplicity of nodes (more than two) to be in error simultaneously to mask the original error.

The third method involves a modification to the MISR so that the error is propagated to more than one location within the MISR before actuating the next probe line.

These three methods, when used either alone or in combination, reduce the probability of masking an error to a negligible number when using the "Cross-Check" testing apparatus.

DETAILED DESCRIPTION OF THE PREFERRED EMBODIMENT

Figure 2:
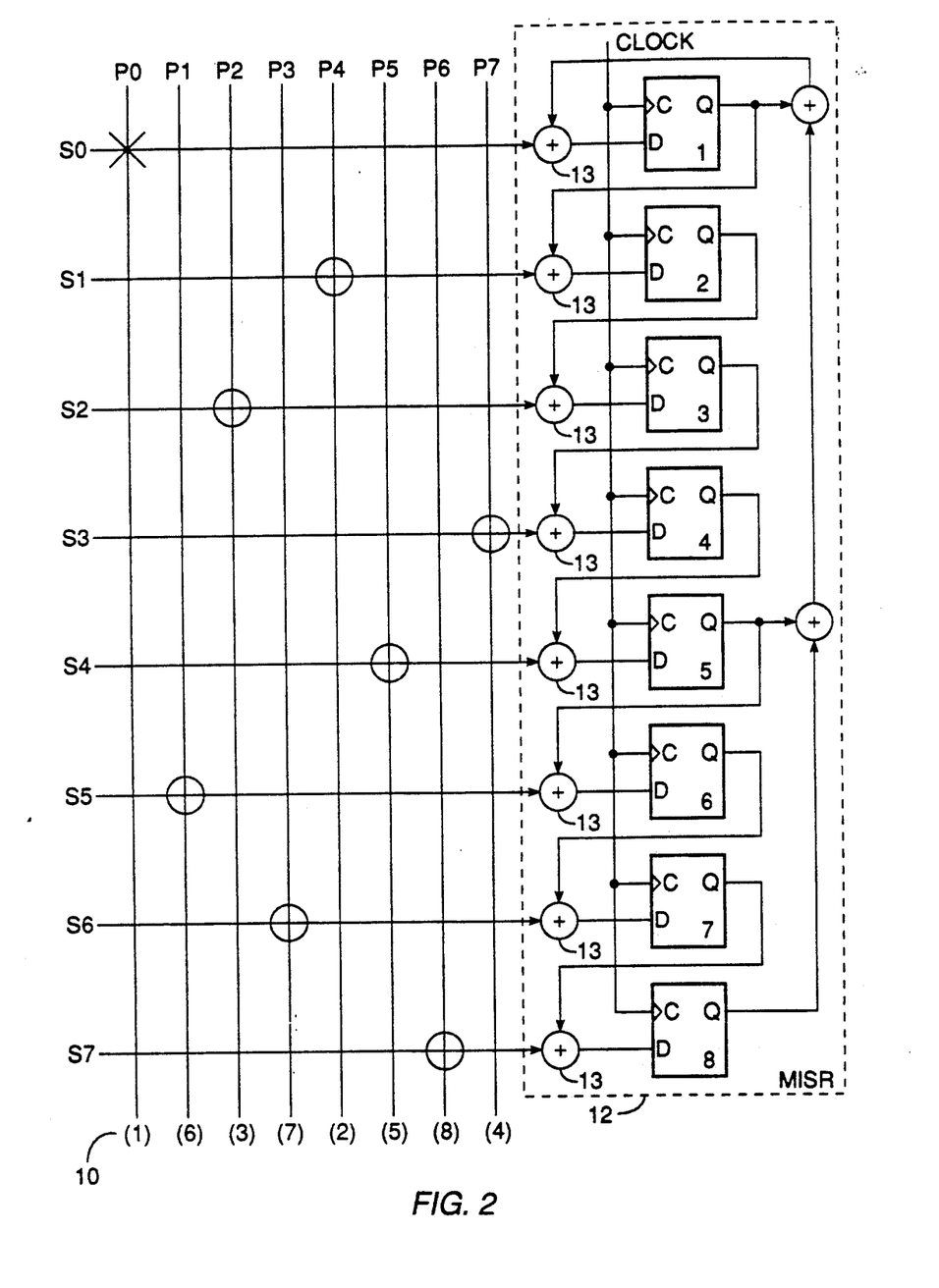
FIG. 2 is a schematic diagram showing an MISR being addressed by a non-linear sequence.

The first method for preventing masking of errors in accordance with the present invention uses nonlinear addressing such that the probe lines are not activated in a linear sequence. With reference to FIG. 2, which is a schematic diagram illustrating an activation sequence 10 in a "Cross-Check" system coupled to MISR 12 through XOR gates 13, the actuation sequence 10 might be $P_0$, $P_4$, $P_2$, $P_7$, $P_5$, $P_1$, $P_3$, and $P_6$ as listed by sequence indicator 10. In this addressing technique, masking of errors would have to occur at least three cell sites away from the original error.

A cell site is measured by counting the orthogonal paths needed to reach the indicated node(s). Such measurement results in a so-called "Manhattan Distance." For example, if the absence of intervening feedback is assumed, and FIG. 2 is referred to, an error at $P_0S_0$ (indicated by the "X") could be masked by errors occurring at $P_4S_1$, $P_2S_2$, $P_7S_3$, $P_5S_4$, $P_1S_5$, $P_3S_6$, and $P_6S_7$ (as indicated by the "O"'s). This is determined by the activation sequence 10 and the input sequence to MISR 12. In larger arrays, which may have 200 probe lines or more, the distance needed before an error could be masked would be much greater.

If the feedback path on the MISR (1, 5, and 8 in FIG. 2) is small compared to the total number of probe lines, the minimum physical spacing between potential masking of error candidates can be kept quite large. The minimum physical spacing is approximately equal to the number of probe lines divided by the feedback distance in MISR 12. For example, if the output of every fourth MISR register is fed back to the input and there are 200 probe lines, the minimum physical distance can be as much as 50 cell sites away. This reduces the probability of that site having a gate which might be logically proximate to the original gate by at least 2 to 3 orders of magnitude.

Several commonly known techniques may be used for non-linear addressing. For example, the probe lines may be routed in non-linear fashion, a non-binary counter such as a linear feedback shift register or Gray code counter may be used and/or the probe lines might be decoded in a non-binary fashion. Other known techniques for non-linear addressing could of course be used.

The second method encompassed by this invention involves probing the array of test points in the "Cross-Check" testing apparatus two or more times. Each pass through the testing array would address the probe lines in a different manner. For example, referring to FIG. 3, the first pass might address the probe lines in a linear fashion, beginning at $P_0$ and continuing sequentially to $P_7$ (reference number 15 in FIG. 3). The second pass might begin testing at $P_7$ and proceed sequentially in diminishing order to $P_0$ (reference number 16, FIG. 3). If MISR 12 were addressed in this manner, it would fail to detect an error at $P_2S_2$ ("X") if it was masked by an error on $P_3S_3$ ("0") during the first pass (or by an error at $P_4S_4$, two test cycles later, and so forth). On the second pass, the requisite error would have to occur on $P_1S_3$ (or $P_0$, $S_4$ two clocks later, etc.). However, on the second pass, the requisite error would have to occur on $P_1S_3$ (on $P_0S_4$ two clocks later, etc.). However, even on the first pass, an error on $P_1S_3$ would have to be masked by an error on $P_2S_4$. Thus, masking of errors now requires a pattern of not two, but four separate errors all requiring a very specific physical and logical relationship. In the above example, the highest probability is now $P_2^3$ (now $P_2$) or $P_2=(0.0005)^3=0.125(1\times 10^{-6})$.

Figure 3:
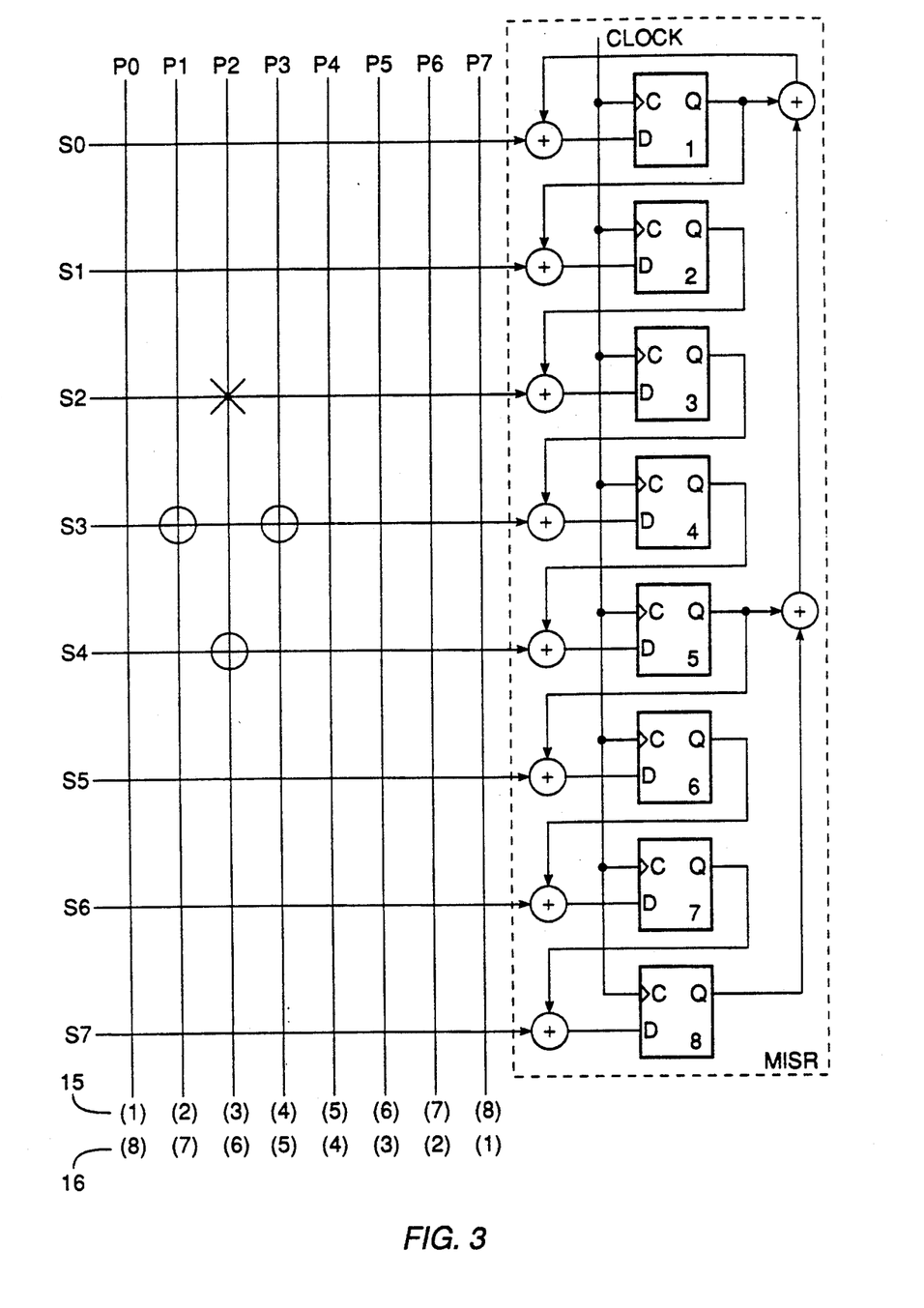
FIG. 3 is a schematic diagram showing an MISR being addressed twice using a given order first and its reverse second.
Figure 4:
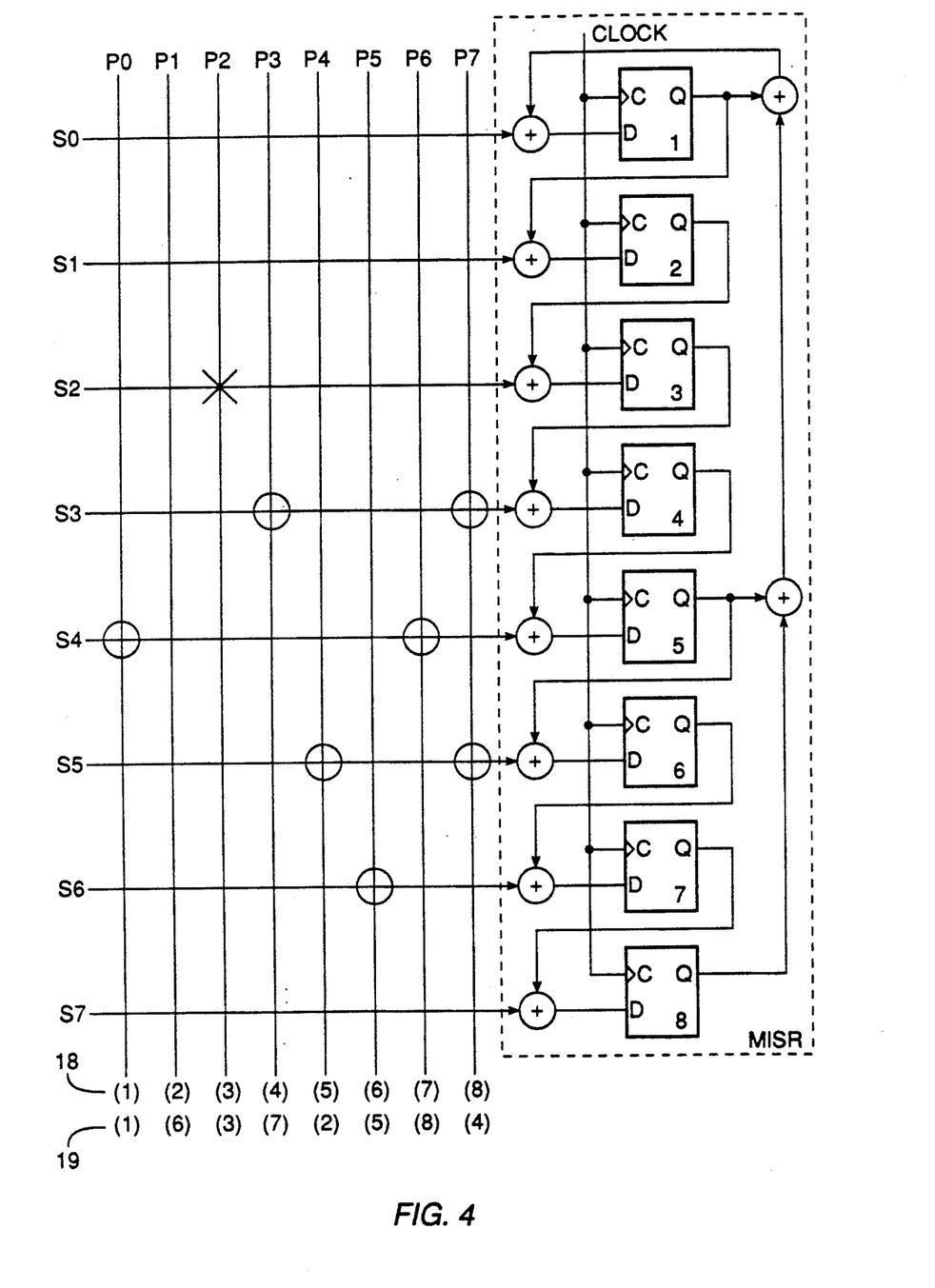
FIG. 4 is a schematic diagram showing an MISR being linearly and non-linearly addressed.

A more complex addressing scheme can easily be designed that eliminates the possibility of a single bit masking two errors as $P_2S_4$ does in FIG. 3. Referring to FIG. 4, consider the linear 18 and non-linear 19 addressing sequence described above for the two passes. $P_2S_2$ could be masked by an error at $P_3S_5$ during the first pass. On the second pass, an error at $P_7S_3$ is required to mask $P_2S_2$ and an error at $P_6S_4$ is needed to mask an error at $P_3S_3$. These in turn require $P_0S_4$ and $P_7S_5$ to be in error the first pass which would necessitate $P_4S_5$ and $P_5S_6$ to be in error on the second pass and so forth. The probability that this number and position of errors would mask another error is sufficiently low in the multiple-pass method that the confidence level that all errors would be found is extremely high.

The third method of eliminating masking of errors involves propagating the error to more than one MISR register location. This can be done in at least three different ways. These are: clocking the MISR a sufficient number of times to guarantee propagation to multiple bit locations before activating the next probe line, loading the error into more than one location, or by feeding the data forward to multiple register inputs.

Referring back to FIG. 1, consider an MISR 12 clocked at least 4 times, such that an error is propagated into at least two locations. Two or more separate errors will now be required to mask the original error. The probability of this occurrence is the square of the original probability (e.g., for the previous example, $P2=(0.005)(0.005)=0.000025$.

Figure 5:
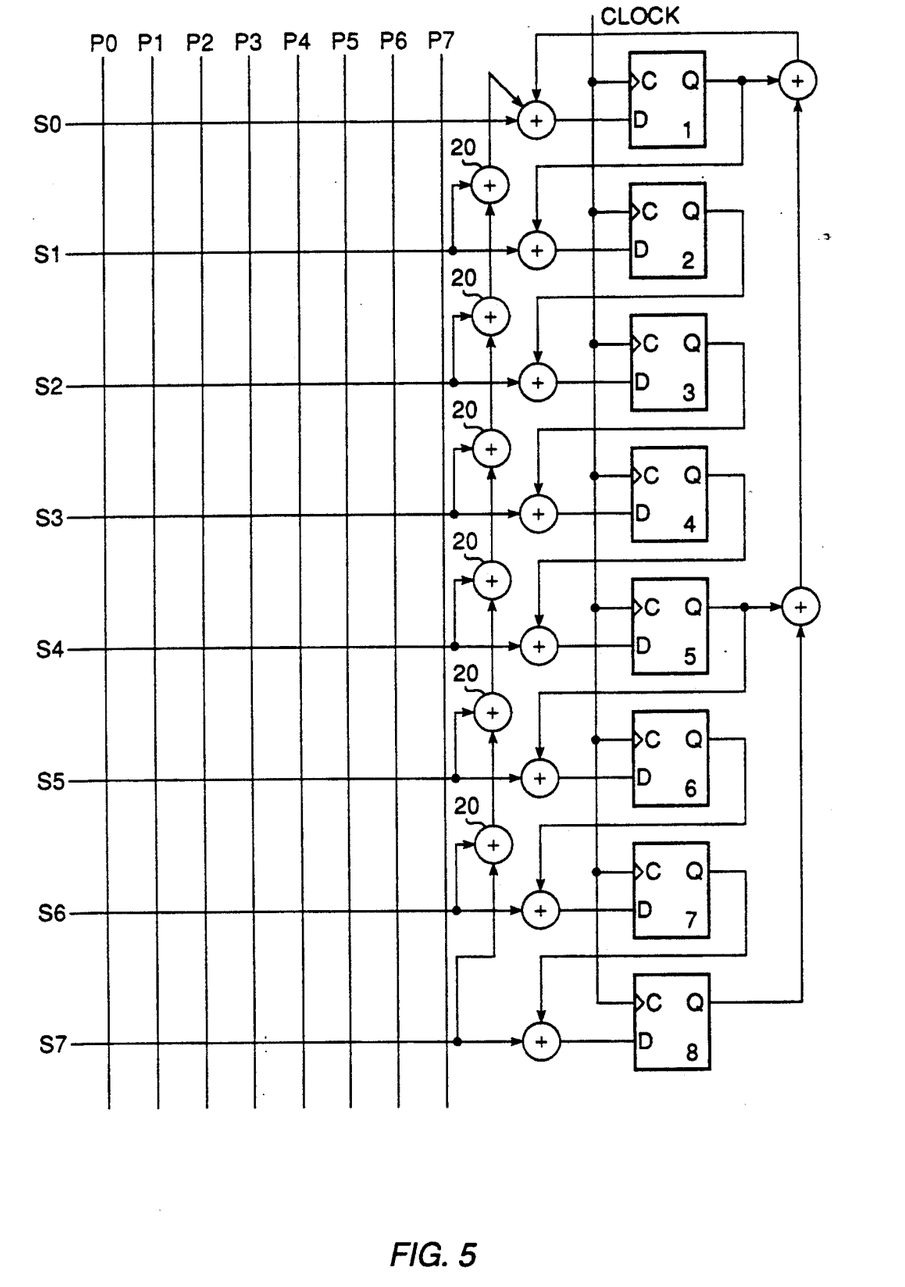
FIG. 5 is a schematic diagram of an MISR wherein errors are loaded into the first bit.
Figure 6:
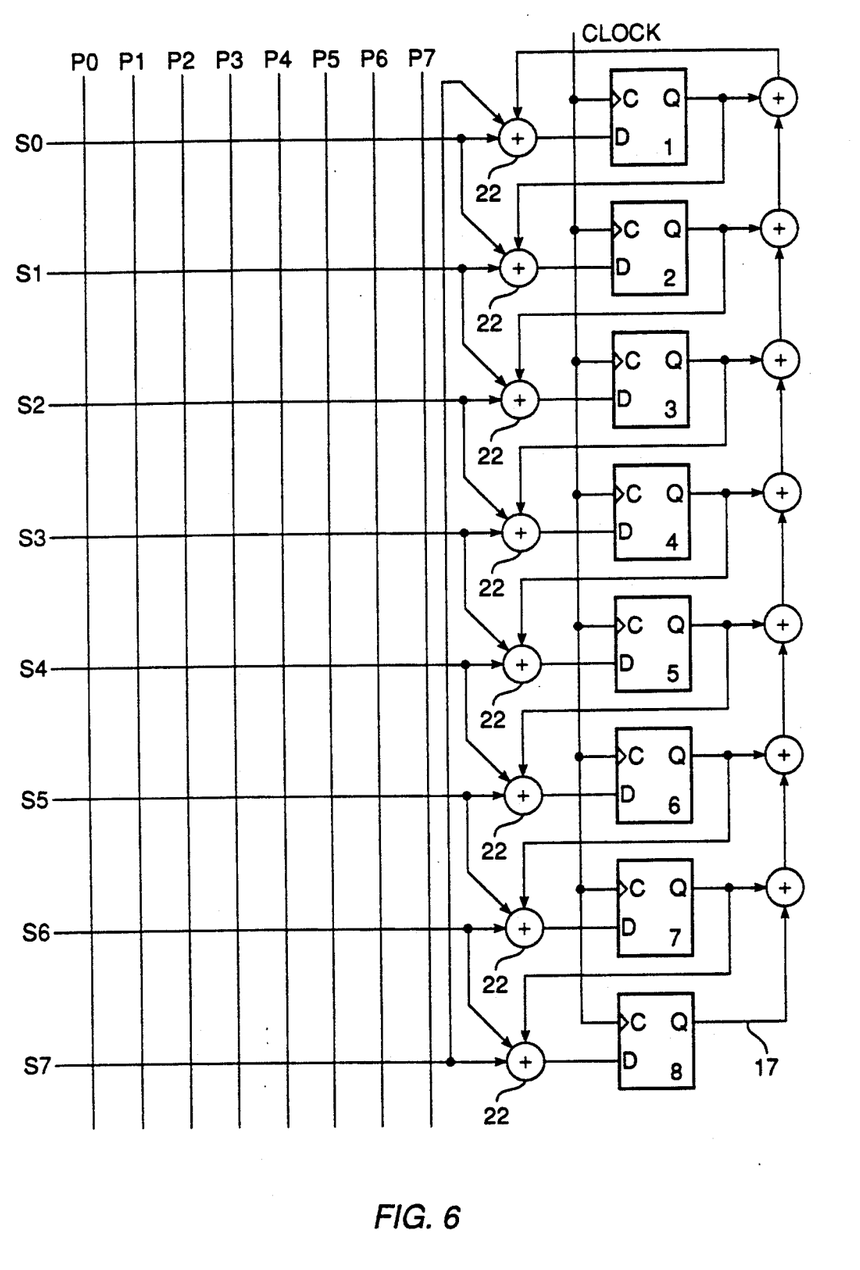
FIG. 6 is a schematic diagram showing an MISR wherein errors are loaded into two adjacent bits.
Figure 7:
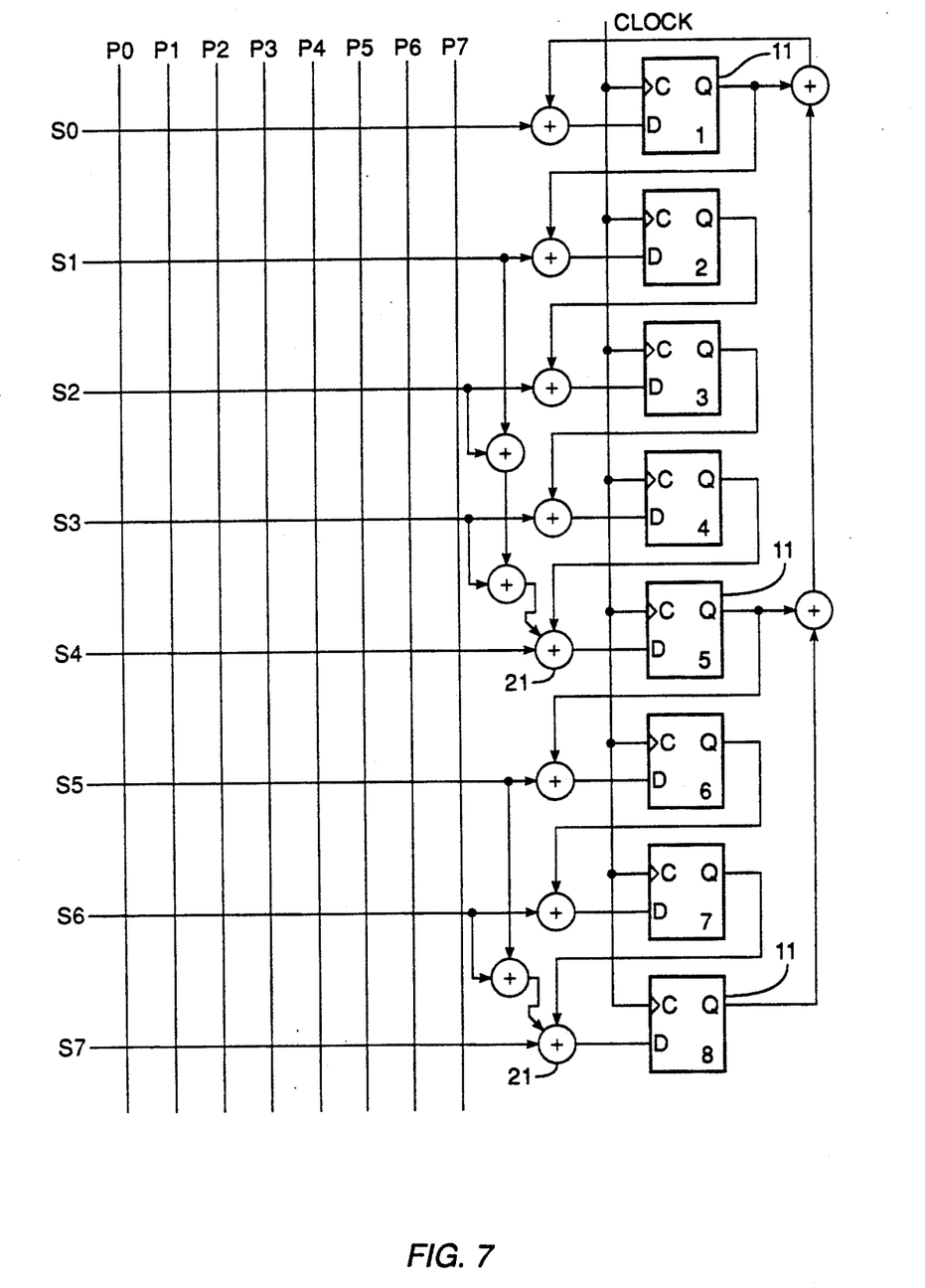
FIG. 7 is a schematic diagram showing an MISR where the error is loaded into an associated MISR bit plus a feedforward bit.

The second method using the propagation idea modifies the MISR 12 so that the error is loaded into two or more locations. Referring to FIG. 5, the error is loaded into the associated MISR register bit and is additionally propagated to the first bit though XOR gates 20. In FIG. 6, the error is loaded into two adjacent bits by XOR gates 22. In this case, all outputs are also immediately fed back via line 17 to the first bit to further eliminate the possibility of masking an error. In FIG. 7, the error is loaded into the associated MISR register bit and fed forward to the next closest register with a feedback bit (see registers 11, FIG. 7) through multiple input XORs 21. Many similar variations are conceivable.

Figure 8:
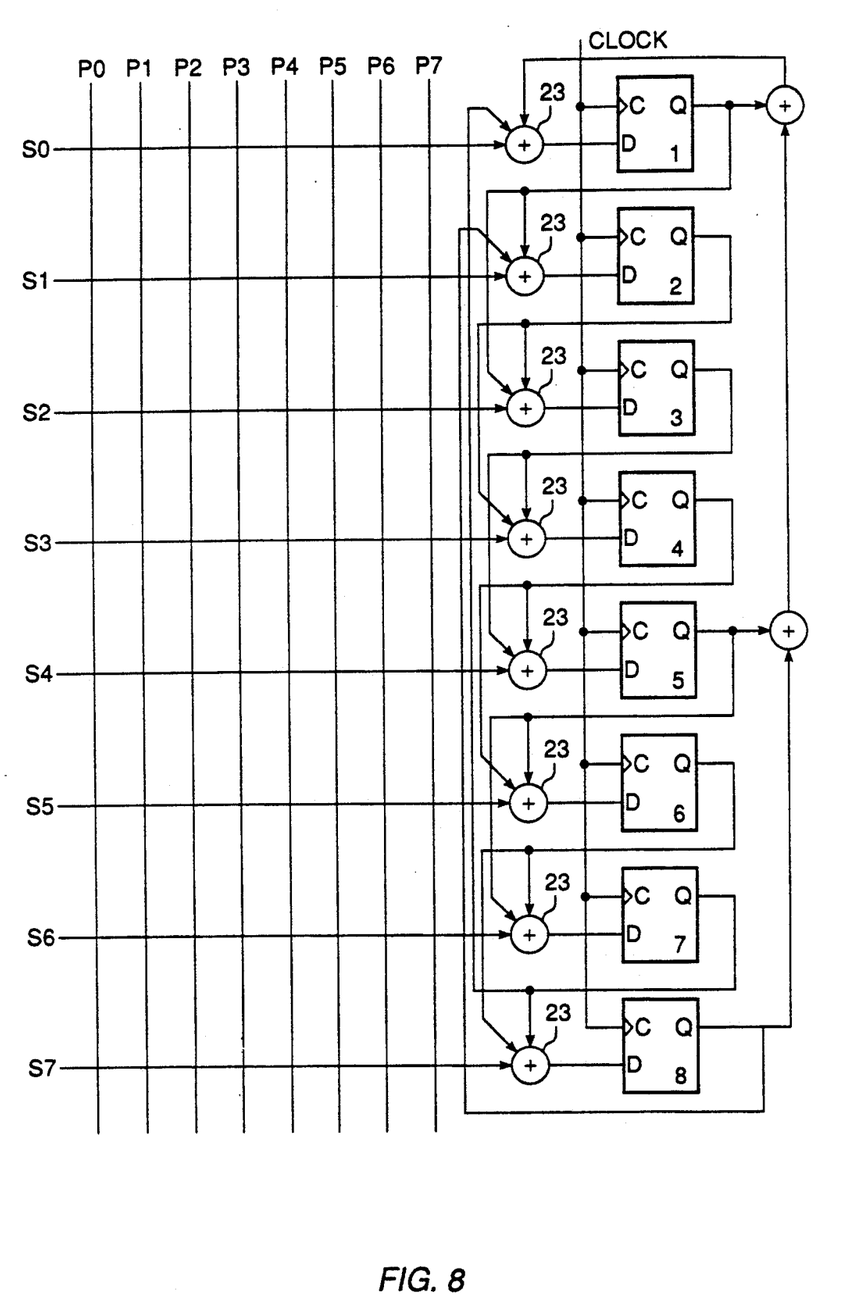
FIG. 8 is a schematic diagram showing a method wherein the output of each register bit is fed forward to two register bits.

The third method using the propagation idea involves reconfiguring MISR 12. Each error bit is loaded into only one register, but the error is multiplied in the register by immediate feedback or fed forward though XOR gates during the next cycle. The method may be combined with the multiple clocking method previously described. For example, FIG. 8 is a schematic diagram showing a "Cross-Check" structure wherein the output of each register bit is fed forward, not only to the next bit, but to the next two bits. This is done through the use of three-input XORs 23. Multiple errors would be needed to mask the first error.

Although the invention has been particularly shown and described with reference to a set of preferred embodiments thereof, it will be understood by those skilled in the art that the foregoing and other changes in the form and details may be made therein without departing from the spirit and scope of the invention.

What is claimed:

1. A method for reducing the masking of errors during the testing of integrated circuits, the testing generating multiple digital data outputs, the digital data outputs being processed and stored in a digital data processing means, the digital data outputs being collected from internal test points in the integrated circuits, the method comprising choosing the order for accessing the test points such that test points coupled to logic gates which are logically proximate to one another are not accessed in sequence from one another;

accessing the nodes using the chosen order; and supplying the digital data outputs generated by the accessing to the digital data processing means.

2. The method of claim 1 wherein the test points are formed as a "Cross-Check" testing array.

3. The method of claim 1 wherein the test points are accessed at least twice, the order of accessing changing each time.

4. A method for reducing the masking of errors during testing of an integrated circuit, the integrated circuit having a plurality of internal testing arranged in a grid pattern, the internal testing nodes being coupled to the logic gates of the integrated circuits, and the testing generating multiple digital data outputs which are compressed in a digital data compression means, the method comprising determining the order for accessing the internal test nodes of the integrated circuits so that logically proximate internal test nodes are not accessed sequentially to insure that possible errors generated by logically proximate logic gates are not supplied to the digital data compression means in sequence;

accessing the internal test nodes in the determined order; and providing the digital data outputs to the digital data compression means.

5. The method of claim 4 wherein the digital data compression means is a multiple input shift register.

6. The method of claim 5 wherein the internal testing nodes are in the form of "Cross-Check" test points.

7. The method of claim 4 wherein the internal testing nodes are in the form of "Cross-Check" testing grids.

8. The method of claim 4 wherein the nodes are accessed at least twice, the order of accessing changing each time.

9. In an integrated circuit having a plurality of internal circuit testing points, the points generating a plurality of digital data outputs, the outputs being applied to a digital data compression means which generates at least one output, a method for reducing the masking of errors comprising activating each internal circuit testing point in a first preset order so that the digital data output from each internal circuit testing point is supplied to the digital data compression means in the first preset order; and activating each internal circuit testing point in a second preset order different from the first preset order so that digital data output is supplied to the digital data compression means at least twice from each internal circuit testing point but in a different order each time it is supplied.

10. The method of claim 9 wherein each node is activated n times, n being a user selected number at least equal to two, the order of activation for each node differing with each activation.

11. A method of reducing the masking of errors in a digital data compression means, the compression means having two or more digital data inputs, at least one digital data output, a plurality of internal registers, and clocking means, the method comprising accepting a first digital data input; and clocking the compression means so that said digital data input is stored in at least two internal registers.

12. A method for reducing the masking of errors when using a multiple input shift register coupled to XOR means for data compression, the digital data possibly containing erroneous data being supplied to the shift register by a testing means, the method comprising generating the digital data from said testing means; and inputting the digital data generated by the testing means into at least two registers of the multiple input shift register.

13. In an integrated circuit testing apparatus wherein a plurality of internal test nodes are coupled to the integrated circuit and generate a plurality of digital test data outputs containing possibly erroneous data, the outputs being supplied to a multiple input shift register having a plurality of digital data inputs, at least one digital output, a plurality of internal registers and feedback paths between the output of each register and the inputs of each register and the inputs of other registers, a method for reducing the masking of errors comprising inputting the digital data from a first test node into a first register;

activating the shift register so that the digital data inputted into the first register is fed back to at least a second different register; and repeating the steps of inputting and activating with each separate digital data input until all digital data inputs have been inputted and fed back in the multiple input shift register.

14. A method for minimizing the masking of errors during use of a structure having data storage for capturing multiple inputs of digital data and compressing said digital data into a common digital data output in order to test an integrated circuits array, said data being derived from a plurality of source nodes within said integrated circuit array, said method comprising the steps of:

inputting said digital data received from said plurality of source nodes in a first preset order to said structure; and inputting said digital data received from said plurality of said source nodes in a second differing preset order to said structure.

15. A method for minimizing the masking of errors during use of a structure having data storage which proliferates characteristics of input data throughout said structure, said structure for capturing multiple inputs of digital data and compressing said digital data into a common digital data output in order to test an integrated circuit said data being derived from a plurality of source nodes within said integrated circuit, said method comprising the steps of:

inputting said digital data received from said plurality of source nodes in a first preset order to said structure; and propagating said digital data sufficiently to produce at least one duplicate of said digital data.

16. The method according to claim 15 wherein said propagating step comprises clocking said digital data to create said at least one duplicate.

17. The method according to claim 15 wherein said propagating step comprises loading said digital data into multiple address locations simultaneously to create said at least one duplicate.

* * * * *